(12) United States Patent
Zhang

(10) Patent No.: US 11,063,153 B2
(45) Date of Patent: Jul. 13, 2021

(54) THIN-FILM TRANSISTOR STRUCTURE AND MANUFACTURING METHOD THEREOF, AND DISPLAY PANEL HAVING THE SAME

(71) Applicant: Wuhan China Star Optoelectronics Semiconductor Display Technology Co., Ltd., Wuhan (CN)

(72) Inventor: Weibin Zhang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 69 days.

(21) Appl. No.: 16/492,946

(22) PCT Filed: Dec. 21, 2018

(86) PCT No.: PCT/CN2018/122696
§ 371 (c)(1),
(2) Date: Sep. 11, 2019

(87) PCT Pub. No.: WO2020/010804
PCT Pub. Date: Jan. 16, 2020

(65) Prior Publication Data
US 2020/0251595 A1    Aug. 6, 2020

(30) Foreign Application Priority Data

Jul. 12, 2018   (CN) .......................... 201810762266.8

(51) Int. Cl.
*H01L 29/04* (2006.01)
*H01L 29/786* (2006.01)
(Continued)

(52) U.S. Cl.
CPC .. *H01L 29/78618* (2013.01); *H01L 21/02532* (2013.01); *H01L 21/02592* (2013.01);
(Continued)

(58) Field of Classification Search
CPC ......... H01L 29/78678; H01L 29/78618; H01L 29/66765; H01L 21/02675; H01L 27/3262; H01L 21/02532; H01L 21/02592
See application file for complete search history.

(56) References Cited

U.S. PATENT DOCUMENTS 7,633,595 B2 * 12/2009 Kim .................. G02F 1/133707
349/106
2012/0107983 A1 * 5/2012 Choi ...................... H01L 21/77
438/34
(Continued)

*Primary Examiner* — Phuc T Dang

(57) ABSTRACT

A manufacturing method of a thin film transistor is provided, which includes steps of: providing a flexible substrate with an active layer formed thereon; providing a dielectric layer disposed on the active layer, wherein the dielectric layer has openings; providing a heavily doped silicon layer in the openings, wherein the heavily doped silicon layer is connected to the active layer, extends upward along a sidewall of the openings, and covers an upper surface of the dielectric layer, and the heavily doped silicon layer configured as at least one source/drain; and providing a metal layer in the openings and on the at least one source/drain, wherein the metal layer is connected to the at least one source/drain. The active layer and the source/drain are formed as a same semiconductor material, so that contact resistance can be effectively lowered, thereby improving energy consumption.

17 Claims, 2 Drawing Sheets

(51) Int. Cl.
*H01L 21/02* (2006.01)
*H01L 27/12* (2006.01)
*H01L 29/417* (2006.01)
*H01L 29/66* (2006.01)
*H01L 27/32* (2006.01)
*H01L 51/00* (2006.01)

(52) U.S. Cl.
CPC .... *H01L 21/02675* (2013.01); *H01L 27/1218* (2013.01); *H01L 27/1222* (2013.01); *H01L 27/1274* (2013.01); *H01L 29/41733* (2013.01); *H01L 29/66765* (2013.01); *H01L 29/78678* (2013.01); *H01L 29/78696* (2013.01); *H01L 27/3262* (2013.01); *H01L 51/0097* (2013.01); *H01L 2251/5338* (2013.01)

(56) References Cited

U.S. PATENT DOCUMENTS

| | | | |
|---|---|---|---|
| 2012/0261666 A1* | 10/2012 | Yen | H01L 27/1288 257/59 |
| 2014/0054580 A1* | 2/2014 | Ning | H01L 29/66765 257/43 |
| 2016/0181415 A1* | 6/2016 | Masuda | H01L 29/0611 257/77 |

* cited by examiner

THIN-FILM TRANSISTOR STRUCTURE AND MANUFACTURING METHOD THEREOF, AND DISPLAY PANEL HAVING THE SAME

RELATED APPLICATIONS

This application is a National Phase of PCT Patent Application No. PCT/CN2018/122696 having International filing date of Dec. 21, 2018, which claims the benefit of priority of Chinese Patent Application No. 201810762266.8 filed on Jul. 12, 2018. The contents of the above applications are all incorporated by reference as if fully set forth herein in their entirety.

FIELD AND BACKGROUND OF THE INVENTION

The present invention relates to a thin film transistor structure, and more particularly, to a thin film transistor structure of a flexible organic light emitting display, a manufacturing method thereof, and a display panel having the same.

A flexible organic light emitting display structure (for example, an active-matrix organic light emitting diode, AMOLED) has advantages such as being self-luminous, wide viewing angles, high color saturation, high contrast, low driving voltage, low power consumption, fast response times, being light weight, simple structures, low cost, etc., so there is no need to place a backlight module. Furthermore, the flexible organic light emitting display structure can apply a very thin organic material coating layer and glass substrate, so that the display structure can be thinner than conventional displays.

However, in the conventional art, amorphous silicon is recrystallized to form polycrystalline silicon by applying excimer laser annealing (ELA), and then doped, and a metal electrode is formed thereon.

Because of a strong Fermi level pinning effect at an interface between semiconductor polysilicon and a contact surface of the metal, there is a high metal-semiconductor contact potential energy barrier, so that a contact resistance is large. Increasing a contact area between a semiconductor and metal is the easiest and most effective way to reduce the resistance. But it still has to develop other ways to reduce on-resistance in order to improve energy consumption. Furthermore, when the excimer laser annealing is applied to amorphous silicon (a-Si), using a laser pulse to irradiate a surface of amorphous silicon to make amorphous silicon dissolved and recrystallized. However, pinholes are formed in the structure because impurities and defects in the amorphous silicon in the manufacturing process. Therefore, when applying the excimer laser annealing, a high-energy laser may pass through the pinholes and irradiate the substrate. In a glass substrate case, the glass substrate can withstand the high energy laser irradiation. However, when a polymer is used as the flexible substrate, because the polymer flexible substrate has a low glass transition temperature and a high absorption rate for ultraviolet light, Therefore, it is difficult to withstand the laser energy density of the excimer laser annealing; it may cause the flexible substrate to be broken or hardened.

However, the flexible organic light emitting display still has the following problems in actual use, for example, the on-resistance of the flexible organic light emitting display is a key factor for improving energy consumption. The resistance often comes from the contact resistance at the interface between the metal and the semiconductor, and the metal-semiconductor contact potential energy barrier is high, so that the contact resistance is large.

Therefore, it is necessary to provide a thin film transistor structure to solve the problems of the conventional art.

Technical Problem

The invention provides a thin film transistor structure, a manufacturing method thereof, and a display panel having the same, so as to solve the existing problem of conventional art that the contact resistance is too high and cause high energy consumption. It can also solve the problem that damage of the flexible substrate caused by the excimer laser annealing.

SUMMARY OF THE INVENTION

A main object of the present invention is to provide a thin film transistor structure which an active layer and a source/drain electrode disposed thereon can be made of a semiconductor material, so that the contact resistance of the source/drain electrode is lowered.

A secondary object of the present invention is to provide a thin film transistor structure which can solve the problem that damage of the flexible substrate caused by the excimer laser annealing.

In order to achieve the foregoing objects of the present invention, an embodiment of the present invention provides a manufacturing method of a thin film transistor, including steps of: providing a flexible substrate with an active layer formed thereon; providing a dielectric layer disposed on the active layer, wherein the dielectric layer has a plurality of openings; providing a heavily doped silicon layer in the openings, wherein the heavily doped silicon layer is connected to the active layer, extends upward along a sidewall of the openings, and covers an upper surface of the dielectric layer, and the heavily doped silicon layer configured as at least one source and at least one drain; and providing a metal layer in the openings and on the at least one source and the at least one drain, wherein the metal layer is connected to the at least one source and the at least one drain.

Moreover, another embodiment of the present invention provides a thin film transistor structure, including: a flexible substrate formed with an active layer thereon; a dielectric layer disposed on the active layer, and having a plurality of openings; a heavily doped silicon layer disposed in the openings and connected to the active layer, wherein the heavily doped silicon layer extends upward along a sidewall of the openings and covers an upper surface of the dielectric layer, and the heavily doped silicon layer is configured as at least one source and at least one drain; and a metal layer disposed in the openings and on the at least one source and the at least one drain, wherein the metal layer is connected to the at least one source and the at least one drain.

Furthermore, yet another embodiment of the present invention provides a display panel, including: a thin film transistor structure, including: a flexible substrate formed with an active layer thereon; a dielectric layer disposed on the active layer, and having a plurality of openings; a heavily doped silicon layer disposed in the openings and connected to the active layer, wherein the heavily doped silicon layer extends upward along a sidewall of the openings and covers an upper surface of the dielectric layer, and the heavily doped silicon layer is configured as at least one source and at least one drain; and a metal layer disposed in the openings and on the at least one source and the at least one drain, wherein the metal layer is connected to the at least one source and the at least one drain.

In an embodiment of the invention, the manufacturing method further includes steps of: forming a gate electrode on the flexible substrate; forming a first amorphous silicon layer on the gate electrode; and applying an excimer laser annealing to the first amorphous silicon layer by using the gate electrode as a mask, so as to modify the first amorphous silicon layer to form the active layer, wherein the active layer is stacked on the gate electrode.

In an embodiment of the invention, the manufacturing method further includes a step of: etching the active layer such that the active layer and the gate electrode have the same width and pattern.

In an embodiment of the invention, before the step of forming the first amorphous silicon layer, the manufacturing method further includes a step of: providing a gate insulating layer on the gate electrode and the flexible substrate, wherein the gate insulating layer has a flat surface; and wherein the step of providing the heavily doped silicon layer in the of openings further includes a step of: disposing the heavily doped silicon layer on the flat surface and in contact with the flat surface.

In an embodiment of the invention, the heavily doped silicon layer is connected to the active layer by connecting a sidewall of the heavily doped silicon layer that is in contact with the openings to the active layer.

In an embodiment of the invention, a projected area of the active layer is larger than a projected area of the gate electrode.

In an embodiment of the invention, the active layer has an upper surface, and the heavily doped silicon layer is in contact with the upper surface of the active layer.

In an embodiment of the invention, the step of forming the active layer further includes a step of: applying a first heavily doping process to a portion of the active layer; and the step of providing the heavily doping silicon layer further includes a step of: applying a second heavily doping process to the heavily doped silicon layer.

Beneficial Effect

Compared with the conventional art, the thin film transistor structure of the present invention can not only prevent the flexible substrate destroyed by using the gate electrode as a mask when an excimer laser annealing is applied, but also possible to lower the contact resistance of drain/source by using the active layer and the drain/source electrode disposed thereon as the semiconductor material.

BRIEF DESCRIPTION OF THE SEVERAL VIEWS OF THE DRAWINGS

In order to make the above description of the present invention more comprehensible, preferred embodiments of the present invention are described below, and in conjunction with the accompanying drawings, unless otherwise specified, in the figures, the same reference numerals are used for the elements, features and signals that have the same or at least the same function.

DESCRIPTION OF SPECIFIC EMBODIMENTS OF THE INVENTION

The following description of the various embodiments in conjunction with the accompanying drawings is provided to illustrate the specific embodiments of the invention. Furthermore, the directional terms mentioned in the present invention, such as upper, lower, top, bottom, front, rear, left, right, inner, outer, side, surrounding, central, horizontal, horizontal, vertical, longitudinal, axial, radial, uppermost or lowermost, etc., only refer to the direction of the accompanying drawings. Therefore, the directional terminology used is for the purpose of illustration and understanding of the invention.

The singular terms "a", "an", and "at least one" including plural forms, unless the context clearly dictates otherwise. For example, the term "a gate electrode" or "at least one gate electrode" can include a plurality of gates.

Figure 1:
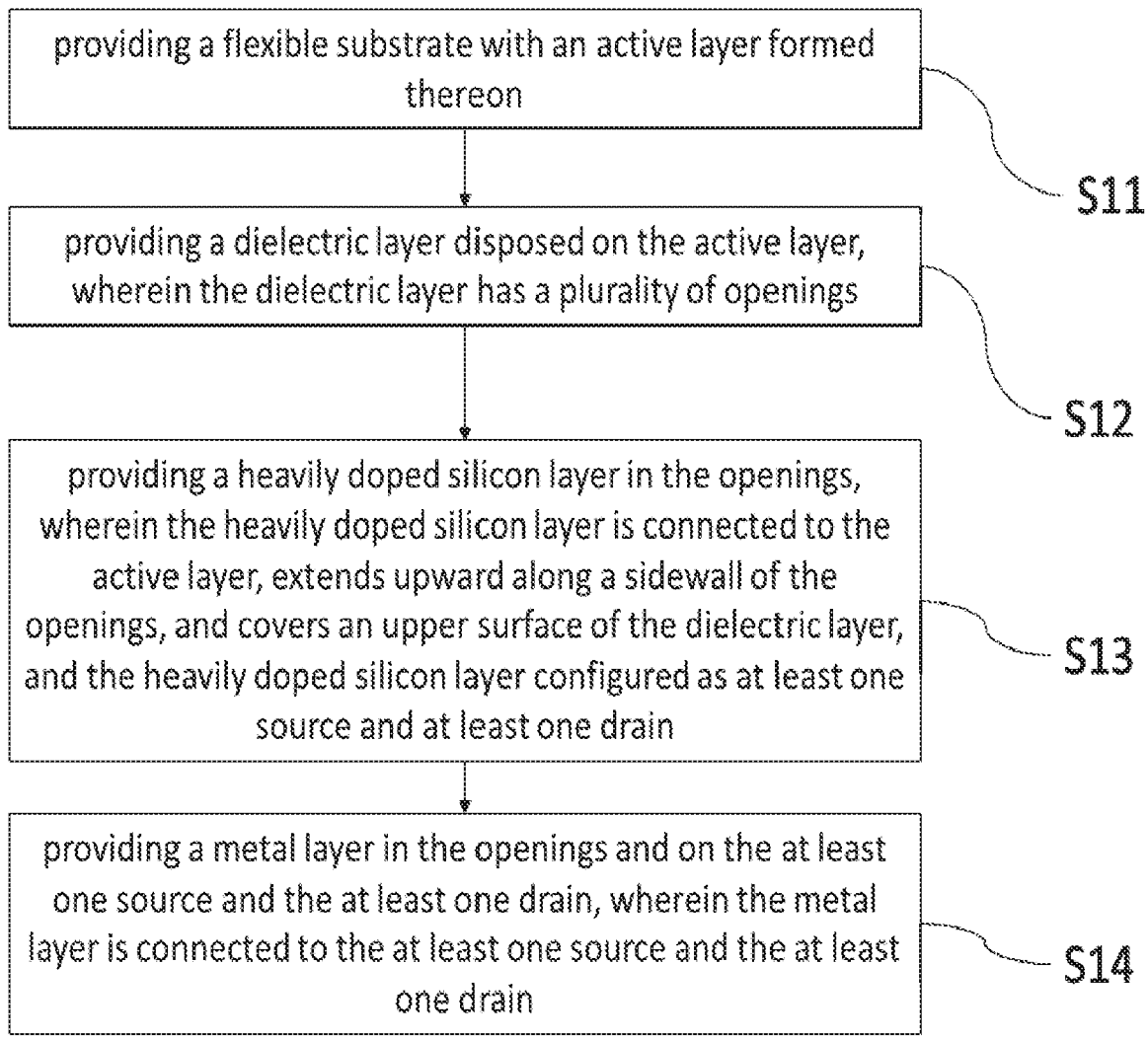
FIG. 1 is a schematic view showing a manufacturing method of a thin film transistor according to a first embodiment of the present invention.

Please refer to FIG. 1, which shows a manufacturing method of a thin film transistor according to a first embodiment of the present invention, the manufacturing method of the thin film transistor mainly includes the following steps of:

Step S11: providing a flexible substrate 120 with an active layer 151 formed thereon;

Step S12: providing a dielectric layer 150 disposed on the active layer 151, wherein the dielectric layer 150 has a plurality of openings 154;

Step S13: providing a heavily doped silicon layer in the openings 154, wherein the heavily doped silicon layer is connected to the active layer 151, extends upward along a sidewall of the openings 154, and covers an upper surface of the dielectric layer 150, and the heavily doped silicon layer configured as at least one source 152 and at least one drain 153; and Step S14: providing a metal layer in the openings 154 and on the at least one source 152 and the at least one drain 153, wherein the metal layer is connected to the at least one source 152 and the at least one drain 153.

Hereinafter detailed configurations, assembly relationships, and operating principles of the elements of the first embodiment of the present invention in conjunction with the accompanying drawing are described.

Figure 2:
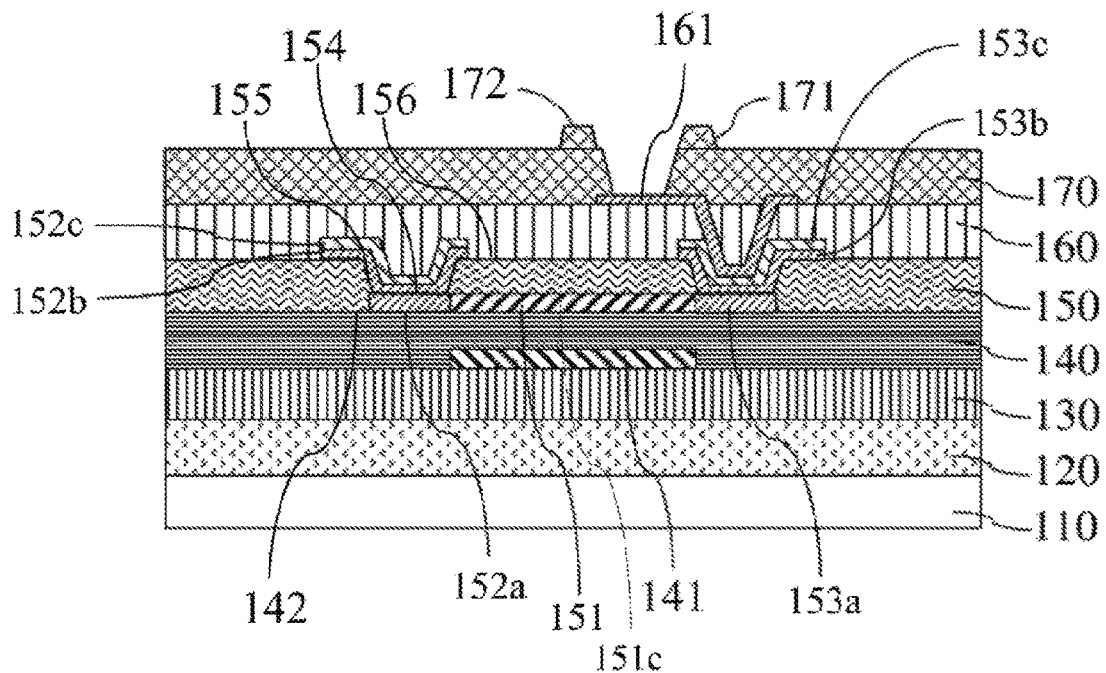
FIG. 2 is a cross-sectional view showing the thin film transistor structure of the first embodiment of the present invention.

Please refer to FIG. 2 and the step S11 of FIG. 1, a substrate 110 is provided according to the first embodiment of the present invention. The substrate 110 may be a glass substrate, and a flexible substrate 120 is disposed on the substrate. Material of the flexible substrate 120 may be made of, but not limited to, polyimide (PI), polyethylene terephthalate (PET), polyetheretherketone (PEEK), polyethersulfone (PES), or the like. A buffer layer 130 is provided on the flexible substrate 120. Material of the buffer layer 130 may be made of silicon oxide, silicon nitride or a combination thereof. Next, a gate electrode 141 is formed on the flexible substrate and the buffer layer 130. The gate electrode 141 can be formed by depositing and patterning, for example, by physical vapor deposition, chemical vapor deposition, or plasma enhanced chemical vapor deposition. Then, a gate insulating layer 140 is formed on the gate electrode 141. The gate insulating layer 140 is an inorganic insulating layer or an organic insulating layer. In case of the inorganic insulating layer, the inorganic insulating layer may be made of silicon dioxide, silicon nitride, or the like. In case of the organic insulating layer, the organic insulating layer may be made of polyvinylpyrrolidone, polyimide, propylene or the like. In the case that the gate insulating layer 140 is the inorganic insulating layer, it is formed by plasma enhanced chemical vapor deposition (PECVD).

Please refer to FIG. 2, a first amorphous silicon layer is formed on the gate electrode 141, and an excimer laser annealing process is applied to the first amorphous silicon layer to modify the first amorphous silicon layer as a first polysilicon layer. Then, a channel doping and a first heavily doping treatment process are applied to the first polysilicon layer to form a channel doping region 151c, a source portion 152a of a first heavily doped silicon layer, and a drain portion 153a of the first heavily doped silicon layer, and etching a portion of the first polysilicon layer to apply a patterning process to form the active layer 151. In this embodiment, a projected area of the active layer 151 is larger than a projected area of the gate electrode 141. Therefore, in the step of applying the excimer laser annealing to the first amorphous silicon layer, the flexible substrate 120 may be protected by using the gate electrode 141 as a mask to avoid that laser damages the flexible substrate 120. In this embodiment, the active layer 151 has an upper surface, and a second heavily doped silicon layer is in contact with the upper surface of the active layer 151. In this embodiment, the source portion 152a of the first heavily doped silicon layer and the drain portion 153a of the first heavily doped silicon layer are doped by using an n-type dopant (e.g., containing phosphorus or arsenic), so the source portion 152a of the first heavily doped silicon layer and the drain 153a of the first heavily doped silicon layer form an n-type semiconductor. In the embodiment, the active layer 151 is stacked on the gate electrode 141. In a non-limiting embodiment, the gate electrode 141 is stacked on the active layer 151.

Please refer to FIG. 2 and accompanying with step S12 of FIG. 1, the dielectric layer 150 is disposed on the active layer 151, and the dielectric layer 150 has the plurality of openings 154.

Also referring to FIG. 2 and accompanying with step S13 of FIG. 1, a step of providing the second heavily doped silicon layer in the openings 154 and is electrically connected to the active layer 151. The second heavily doped silicon layer extends upwardly along the sidewall 155 of the openings 154 and covers the upper surface 156 of the dielectric layer 150, the first and second heavily doped silicon layers form at least one source electrode 152 and at least one drain electrode 153. In an embodiment, a source portion 152b and a drain portion 153b of the second heavily doped silicon layer are provided in the openings 154 and are connected to the active layer 151. The step of providing the second heavily doped silicon layer in the openings 154 includes: providing a second amorphous silicon layer or a second polysilicon layer, and then applying a second heavily doping process to the second amorphous silicon layer or the second polysilicon layer, such that the second amorphous silicon layer or the second polysilicon layer forms the second heavily doped silicon layer. Then, applying a patterning process to the second heavily doped silicon layer, such that the second heavily doped silicon layer forms the source portion 152b and the drain portion of the second heavily doped silicon layer 153b. In this embodiment, the source portion 152b and the drain portion 153b of the second heavily doped silicon layer are doped with the n-type dopant (e.g., containing phosphorus or arsenic) such that the source portion 152b and the drain portion 153b form the n-type semiconductor. The source portion 152a of the first heavily doped silicon layer and the source portion 152b of the second heavily doped silicon layer together form the source electrode 152, and the drain portion 153a of the first heavily doped silicon layer and the drain portion 153b of the second heavily doped silicon layer together form the drain electrode 153.

Again, please refer to FIG. 2 and accompanying with step S14 of FIG. 1, which provides the metal layer, and applying a patterning process to the metal layer to form a source portion 152c of the metal layer and a drain portion 153c of the metal layer within the openings 154 and on the source portion 152b and the drain portion 153b of the second heavily doped silicon layer. In one embodiment, the source portion 152c of the metal layer, the source portion 152a of the first heavily doped silicon layer, and the source portion 152b of the second heavily doped silicon layer together form the source electrode 152. The drain portion 153c of the metal layer, the drain portion 153a of the first heavily doped silicon layer, and the drain portion 153b of the second heavily doped silicon layer together form the drain electrode 153. Next, a planarization layer 160 is formed on the source electrode 152 and the drain electrode 153, and an electrode layer 161 is formed on the planarization layer 160. In this embodiment, the electrode layer 161 is an anode metal layer. A pixel defining layer 170 is formed on the electrode layer 161, and photoresist spacers 171 and 172 are formed on the pixel defining layer 170.

Therefore, because a semiconductor-semiconductor contact potential energy barrier is low compared with the metal-semiconductor contact potential energy barrier, such that the contact resistance becomes smaller, and the source portion 152b and the drain portion 153b of the second heavily doped silicon layer are disposed within the openings 154, and electrically connected to the active layer 151, the source portion 152b and the drain portion 153b of the second heavily doped silicon layer upwardly extends along the sidewall 155 of the openings 154 and covers the upper surface 156 of the dielectric layer, such that the contact area can be increased so as to reduce the contact resistance.

Figure 3:
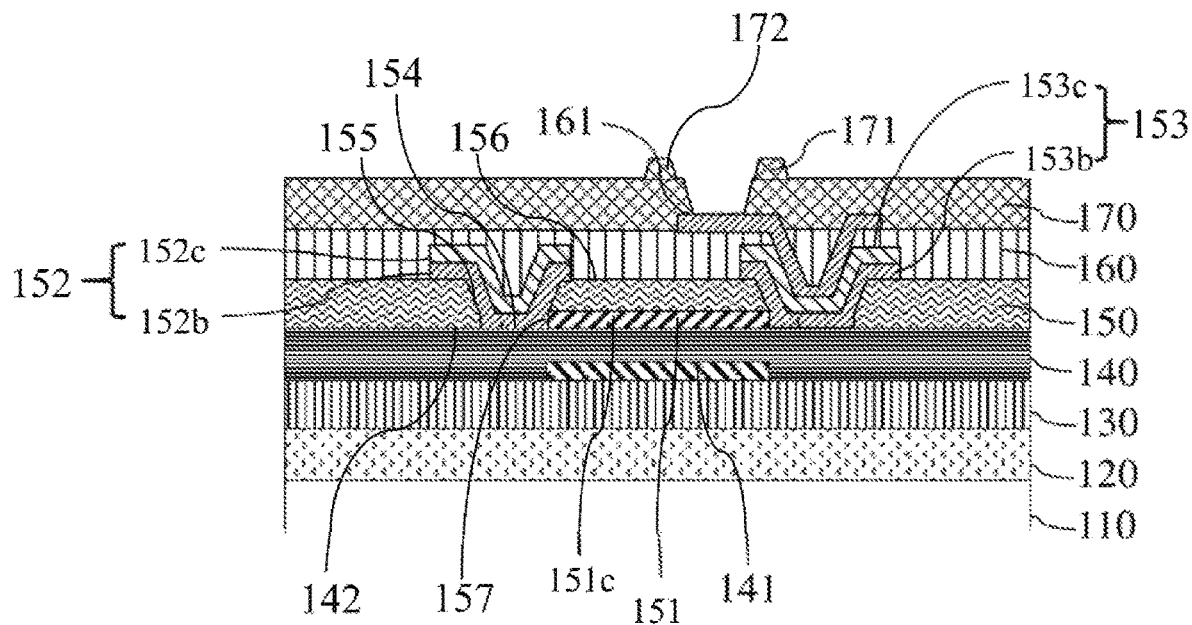
FIG. 3 is a cross-sectional view showing a thin film transistor structure of a second embodiment of the present invention.

Please refer to FIG. 3, a manufacturing method of a thin film transistor according to a second embodiment of the present invention is similar to the first embodiment of the present invention, and substantially uses the same component names and reference numbers, but the differences of the second embodiment are that: the manufacturing method before the step of forming the first amorphous silicon layer includes a step of: disposing a gate insulating layer 140 on a gate electrode 141 and a flexible substrate 120, and the gate insulating layer 140 has a flat surface 142; and the manufacturing method before the step of providing a heavily doped silicon layer in the openings 154 further includes: forming a source portion 152b and a drain portion 153b of the heavily doped silicon layer on the flat surface 142 and in contact with the flat surface 142. An active layer 151 is formed by etching a portion of the first polysilicon layer through a patterning process. The manufacturing method further includes a step of: etching the active layer 151 such that a channel doping region 151c of the active layer 151 and the gate electrode 141 have the same width and pattern. In this embodiment of the present invention, the heavily doped silicon layer is connected to the active layer 151 by connecting a sidewall 157 of the heavily doped silicon layer that is in contact with the openings 154 to the active layer 151.

The thin film transistor structure according to the second embodiment of the present invention omits the step of applying the first heavy doping process. Advantage of the above-mentioned feature are that the manufacturing process is relatively simplified. Therefore, not only the production cost can be reduced, but also the manufacturing time can be saved, thereby further increasing the manufacturing efficiency.

Please return to refer to FIG. 2, the thin film transistor structure according to another embodiment of the present invention is provided, the thin film transistor structure includes: a substrate 110, which may be a glass substrate. The substrate 110 has a flexible substrate 120 formed thereon. Material of the flexible substrate 120 may be made of, but not limited to, polyimide (PI), polyethylene terephthalate (PET), polyetheretherketone (PEEK), polyethersulfone (PES), or the like. A buffer layer 130 is disposed on the flexible substrate 120. Material of the buffer layer 130 may be made of silicon oxide, silicon nitride or a combination thereof. A gate electrode 141 is formed on the flexible substrate and the buffer layer 130. A gate insulating layer 140 is formed on the gate electrode 141. The gate insulating layer 140 may be an inorganic insulating layer or an organic insulating layer. In a case of the inorganic insulating layer, the inorganic insulating layer may be made of silicon dioxide, silicon nitride, or the like. In a case of the organic insulating layer, the organic insulating layer may be made of polyvinylpyrrolidone, polyimide, propylene or the like. The active layer 151 is stacked on the gate electrode 141 and has the channel doping region 151c, the source portion 152a of a first heavily doped silicon layer, and a drain portion 153a of the first heavily doped silicon layer. In this embodiment, a projected area of the active layer 151 is larger than a projected area of the gate electrode 141. In this embodiment, the active layer 151 has an upper surface. A second heavily doped silicon layer is in contact with the upper surface of the active layer. In this embodiment, the source portion 152a of the first heavily doped silicon layer and the drain portion 153a of the first heavily doped silicon layer are n-type semiconductors. A dielectric layer 150 is disposed on the active layer 151, and the dielectric layer 150 has a plurality of openings 154. The second heavily doped silicon layer has a source portion 152b and a drain portion 153b within the openings 154 that is connected to the active layer 151, the second heavily doped silicon layer upwardly extends along a sidewall 155 of the openings 154 and covers an upper surface 156 of the dielectric layer. In this embodiment, the source portion 152b and the drain portion 153b are n-type semiconductors. A source portion 152c of a metal layer and a drain portion 153c of the metal layer are disposed within the openings 154 and disposed on the source portion 152b and the drain portion 153b of the second heavily doped silicon layer. The source portion 152c of the metal layer and the source portion 152b of the heavily doped silicon layer together form a source electrode 152, and the drain portion 153c of the metal layer and the drain portion 153b of the heavily doped silicon layer together form a source electrode 152. The source electrode 152 and the drain electrode 153 have a planarization layer 160 formed thereon and an electrode layer 161 is disposed on the planarization layer 160. In this embodiment, the electrode layer 161 is an anode metal layer. A pixel defining layer 170 is disposed on the electrode layer 161, and photoresist spacers 171, 172 are disposed on the pixel defining layer 170.

Please refer to FIG. 3, a thin film transistor structure according to yet another embodiment of the present invention is provided, The differences of this embodiment are that: the gate insulating layer 140 has a flat surface 142; and the source portion 152b and the drain portion 153b of the heavily doped silicon layer are directly disposed on the flat surface 142 and are in contact with the flat surface 142. In this embodiment, only a channel doping region 151c is provided without the source portion 152a of the first heavily doped silicon layer and the drain portion 153a of the first heavily doped silicon layer. The channel doping region 151c of the active layer 151 and the gate electrode 141 have a same width and pattern. The source portion 152b and the drain portion 153b of the heavily doped silicon layer are connected to the active layer 151 by connecting sidewalls 157 of the source portion 152b and the drain portion 153b of the heavily doped silicon layer that are in contact with the openings to the active layer 151.

As described above, compared with the existing thin film transistor structure, although a contact area between the semiconductor and metal can be increased, but there is a strong Fermi level pinning effect at the contact interface between semiconductor polysilicon and metal, so that the metal-semiconductor contact potential energy barrier is high, which results that the contact resistance is large. The thin film transistor structure according to the present invention can lower the contact resistance of a source/drain by configuring to form the active layer, the source electrode, and the drain electrode thereon as the same semiconductor material, so that the contact resistance can be effectively lowered, thereby improving the energy consumption, and it also can solve the problem existing in the conventional art that the underlying flexible substrate may be damaged when the excimer laser annealing is applied.

The present invention has been described by the above related embodiments. However, the above embodiments are merely examples for implementing the invention. It must be noted that the disclosed embodiments do not limit the scope of the invention. Conversely, modifications and equivalent arrangements are intended to be included within the scope of the invention.

Although specific embodiments of the invention have been described and illustrated herein. It should be understood that one skilled in the art can modify various alternatives and/or equivalents according to the present invention. It should be appreciated that the exemplary embodiments or exemplary examples are by way of example only. It does not intend to limit the scope, applicability or configuration of the present invention. Conversely, the foregoing summary and detailed description implemented in at least one exemplary embodiment are for the purpose that easily illustrates to those skilled in the art. It will be understood that, without departing from the scope of the appended claims and their legal provisions, various changes can be made in the function and arrangement of the elements described in an exemplary embodiment. In general, any modifications or variations of the specific embodiments discussed herein are covered in the scope of the application.

What is claimed is:

1. A manufacturing method of a thin film transistor, comprising steps of:
   providing a flexible substrate with an active layer formed thereon;
   providing a dielectric layer disposed on the active layer, wherein the dielectric layer has a plurality of openings;
   providing a heavily doped silicon layer in the openings, wherein the heavily doped silicon layer is connected to the active layer, extends upward along a sidewall of the openings, and covers an upper surface of the dielectric layer, and the heavily doped silicon layer is configured as at least one source and at least one drain; and
   providing a metal layer in the openings and on the at least one source and the at least one drain, wherein the metal layer is connected to the at least one source and the at least one drain, wherein the manufacturing method further comprises steps of:
forming a gate electrode on the flexible substrate;
forming a first amorphous silicon layer on the gate electrode; and
applying excimer laser annealing to the first amorphous silicon layer by using the gate electrode as a mask, so as to modify the first amorphous silicon layer to form the active layer, wherein the active layer is stacked on the gate electrode.

2. The manufacturing method of the thin film transistor according to claim 1, wherein the manufacturing method further comprises a step of etching the active layer such that the active layer and the gate electrode have the same width and pattern.

3. The manufacturing method of the thin film transistor according to claim 2, wherein before the step of forming the first amorphous silicon layer, the manufacturing method further comprises a step of providing a gate insulating layer on the gate electrode and the flexible substrate, wherein the gate insulating layer has a flat surface; and
wherein the step of providing the heavily doped silicon layer in the of openings further comprises a step of disposing the heavily doped silicon layer on the flat surface and in contact with the flat surface.

4. The manufacturing method of the thin film transistor according to claim 3, wherein the heavily doped silicon layer is connected to the active layer by connecting a sidewall of the heavily doped silicon layer in contact with the openings to the active layer.

5. The manufacturing method of the thin film transistor according to claim 1, wherein a projected area of the active layer is larger than a projected area of the gate electrode.

6. The manufacturing method of the thin film transistor according to claim 5, wherein the active layer has an upper surface, and the heavily doped silicon layer is in contact with the upper surface of the active layer.

7. The manufacturing method of the thin film transistor according to claim 1, wherein the step of forming the active layer further comprises a step of: applying a first heavily doping process to a portion of the active layer; and the step of providing a heavily doping silicon layer further comprises a step of: applying a second heavily doping process to the heavily doped silicon layer.

8. A thin film transistor structure, comprising:
a flexible substrate formed with an active layer thereon;
a dielectric layer disposed on the active layer, and having a plurality of openings;
a heavily doped silicon layer disposed in the openings and connected to the active layer, wherein the heavily doped silicon layer extends upward along a sidewall of the openings and covers an upper surface of the dielectric layer, and the heavily doped silicon layer is configured as at least one source and at least one drain; and
a metal layer disposed in the openings and on the at least one source and the at least one drain, wherein the metal layer is connected to the at least one source and the at least one drain,
wherein the thin film transistor structure further comprises: a gate insulating layer disposed on the gate electrode and the flexible substrate, wherein the gate insulating layer has a flat surface; and
the heavily doped silicon layer is disposed on the flat surface and in contact with the flat surface.

9. The thin film transistor structure according to claim 8, wherein the thin film transistor structure further comprises:
gate electrode disposed on the flexible substrate, wherein the active layer and the gate electrode have the same width and pattern.

10. The thin film transistor structure according to claim 9, wherein a projected area of the active layer is larger than a projected area of the gate electrode.

11. The thin film transistor structure according to claim 10, wherein the active layer has an upper surface, and the heavily doped silicon layer is in contact with the upper surface of the active layer.

12. The thin film transistor structure according to claim 8, wherein the heavily doped silicon layer is connected to the active layer by connecting a sidewall of the heavily doped silicon layer in contact with the openings to the active layer.

13. A display panel, comprising:
a thin film transistor structure, comprising:
a flexible substrate formed with an active layer thereon;
a dielectric layer disposed on the active layer, and having a plurality of openings;
a heavily doped silicon layer disposed in the openings and connected to the active layer, wherein the heavily doped silicon layer extends upward along a sidewall of the openings and covers an upper surface of the dielectric layer, and the heavily doped silicon layer is configured as at least one source and at least one drain; and
a metal layer disposed in the openings and on the at least one source and the at least one drain, wherein the metal layer is connected to the at least one source and the at least one drain,
wherein the display panel further comprises a gate insulating layer disposed on the gate electrode and the flexible substrate, wherein the gate insulating layer has a flat surface; and
the heavily doped silicon layer is disposed on the flat surface and in contact with the flat surface.

14. The display panel according to claim 13, wherein the display panel further comprises:
the gate electrode disposed on the flexible substrate, wherein the active layer and the gate electrode have the same width and pattern.

15. The display panel according to claim 14, wherein a projected area of the active layer is larger than a projected area of the gate electrode.

16. The display panel according to claim 15, wherein the active layer has an upper surface, and the heavily doped silicon layer is in contact with the upper surface of the active layer.

17. The display panel according to claim 13, wherein the heavily doped silicon layer is connected to the active layer by connecting a sidewall of the heavily doped silicon layer that is in contact with the openings to the active layer.

* * * * *